(12) United States Patent
Moschiano et al.

(10) Patent No.: US 7,848,158 B2
(45) Date of Patent: Dec. 7, 2010

(54) METHODS AND APPARATUSES FOR PROGRAMMING FLASH MEMORY USING MODULATED PULSES

(75) Inventors: Violante Moschiano, Bacoli (FR); Tommaso Vali, Sezze (FR); Giovanni Santin, Rieti (FR); Walter Di Francesco, Silvi Marina (FR)

(73) Assignee: Micron Technologies, Inc., Boise, ID (US)

( * ) Notice: Subject to any disclaimer, the term of this patent is extended or adjusted under 35 U.S.C. 154(b) by 222 days.

(21) Appl. No.: 12/151,265

(22) Filed: May 5, 2008

(65) Prior Publication Data

US 2009/0273981 A1    Nov. 5, 2009

(51) Int. Cl.
*G11C 7/00* (2006.01)
(52) U.S. Cl. .............................. 365/189.11; 365/185.08; 365/185.19
(58) Field of Classification Search ............ 365/189.11, 365/185.08, 185.09, 185.19
See application file for complete search history.

(56) References Cited

U.S. PATENT DOCUMENTS

| | | | | |
|---|---|---|---|---|
| 6,353,559 B2 * | 3/2002 | Hasegawa et al. | ...... | 365/189.09 |
| 6,961,279 B2 * | 11/2005 | Simko | ...... | 365/226 |
| 7,212,441 B2 * | 5/2007 | Yamazoe et al. | ...... | 365/185.11 |
| 7,545,684 B2 * | 6/2009 | Nakagawa et al. | ...... | 365/189.09 |

* cited by examiner

*Primary Examiner*—Pho M Luu
(74) *Attorney, Agent, or Firm*—Schubert Law Group PLLC; Garland D. Charpiot

(57) ABSTRACT

Methods and apparatuses for programming non-volatile semiconductor memory devices by using modulated pulses are disclosed. An apparatus may have a pulse generator, to create a sequence of pulses and set a threshold voltage of a non-volatile memory cell, and a pulse coupler. The apparatus may have a threshold verifier capable of verifying that the threshold voltage is set within an acceptable voltage range of a target threshold voltage. A pulse width modulator in some apparatuses may modulate the pulse durations early in the sequence when programming fast bits and late in the sequence when programming slow bits. An apparatus may generate a sequence of pulses, apply the sequence of pulses to a memory cell to set a threshold voltage of the memory cell, and modulate one or more of pulses in the sequence the parameters of pulse duration, pulse separation time, and step voltage magnitude.

17 Claims, 4 Drawing Sheets

METHODS AND APPARATUSES FOR PROGRAMMING FLASH MEMORY USING MODULATED PULSES

FIELD

The embodiments herein generally relate to the field of non-volatile memory devices. More particularly, the embodiments relate to methods and apparatuses for programming non-volatile semiconductor memory devices by using modulated pulses.

BACKGROUND

Many different types and styles of semiconductor memory devices exist to store data for electronic devices, such as computers, portable media players, and digital cameras. For example, dynamic random access memory (DRAM) and static random access memory (SRAM) are two types of volatile memory. Programmable read only memory (PROM), electrically erasable programmable read only memory (EEPROM), and flash memory are three common types of non-volatile memory.

Non-volatile memory, such as flash memory, is generally constructed of many memory cells where single bits of data are stored in and read from individual memory cells in a memory array. The cells are generally programmed by hot electron injection and erased by Fowler-Nordheim tunneling or other mechanisms. The erase, program, and read operations are commonly performed by application of appropriate voltages to certain terminals of the memory cells. In erase or write operations, the voltages are applied to the memory cells and cause charges to be removed or stored in the memory cells. In read operations, generally, threshold voltages (Vth) are applied to the cells which cause currents to flow in the cells, wherein the amounts of such currents are indicative of the values of the data stored in the cells. The memory devices usually include appropriate circuitry to sense the resulting cell currents in order to determine the data stored therein.

A significant problem arises from the fact that certain cells (or bits depending on the embodiment) in the memory array tend to be "fast" and others "slow" during a program operation. In other words, these fast and slow cells tend to over-accumulate or under-accumulate charges on their floating gates when programmed, which may alternatively be referred to as threshold voltage sensitivity. Generally, the characteristics of being fast and slow are related to cell physical parameters from manufacturing, such as oxide thickness variations, different channel widths, different floating gate dimensions, etc. Because of these under-accumulation or over-accumulation of charges, these cells tend to have threshold voltages that deviate significantly from target threshold voltages.

Many devices program the memory cells using a sequence of programming pulses. The method of programming involves increasing the voltage of successive pulses up to a maximum voltage, wherein the voltage of each successive pulse increases by a fixed "step" amount. Designers of these prior art devices generally want to program the devices as fast as possible, yet program the threshold voltages relatively close to target threshold values. Unfortunately, fast and slow bits cause the programming times to be relatively long or the distributions of the threshold voltages to be relatively large.

BRIEF DESCRIPTION OF THE DRAWINGS

Aspects of the embodiments will become apparent upon reading the following detailed description and upon reference to the accompanying drawings in which like references may indicate similar elements.

DETAILED DESCRIPTION OF EMBODIMENTS

Figure 1A:
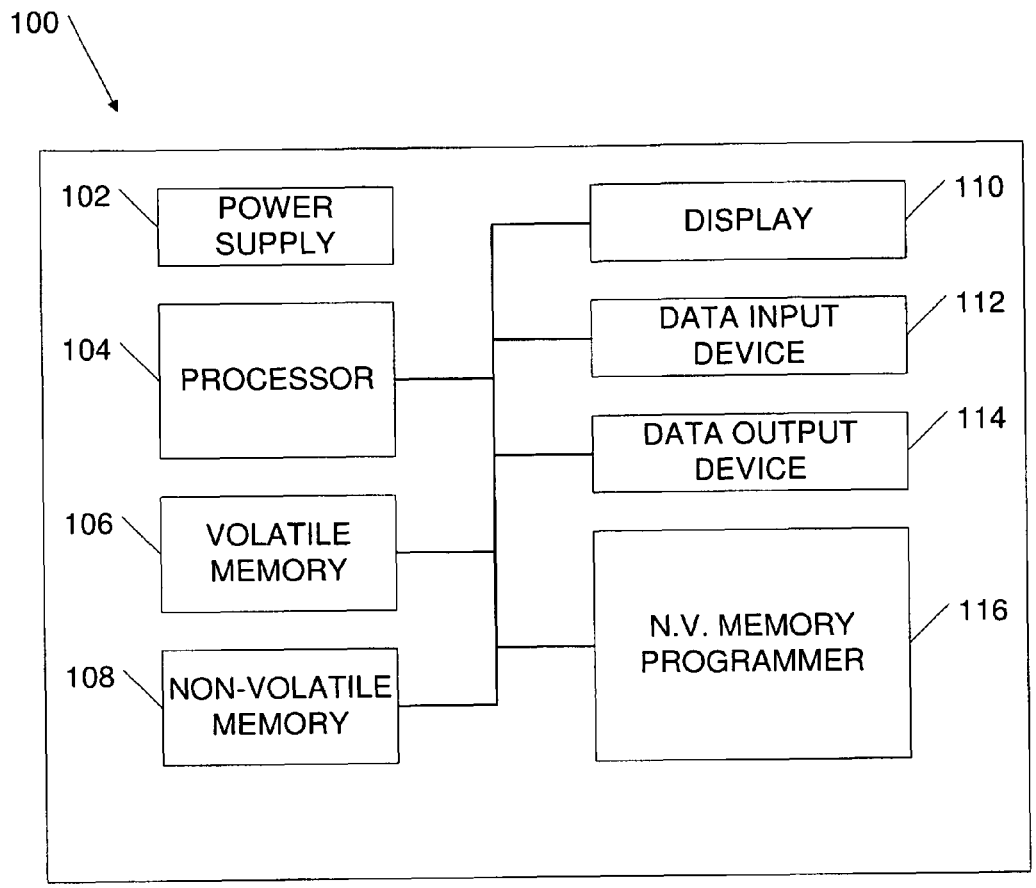
FIG. 1A depicts a system comprising a processor, volatile and non-volatile memory, a display, data input and output devices, and a non-volatile memory programmer.

The following is a detailed description of embodiments depicted in the accompanying drawings. The specification is in such detail as to clearly communicate the embodiments. However, the amount of detail offered is not intended to limit the anticipated variations of embodiments; but on the contrary, the intention is to cover all modifications, equivalents, and alternatives consistent with the spirit and scope of the embodiments as defined by the appended claims.

Generally speaking, methods and apparatuses for programming non-volatile semiconductor memory devices by using modulated pulses are contemplated. Apparatus embodiments generally comprise a pulse generator, to create a sequence of pulses and set a threshold voltage of a non-volatile memory cell, and a pulse coupler. In these embodiments, the pulse generator generally comprises a magnitude adjustor and a pulse width modulator. Alternative embodiments may include a verification circuit capable of verifying that the threshold voltage is set within an acceptable voltage range of a target threshold voltage. Further alternative embodiments may also include a locking circuit to lock the threshold voltage of the non-volatile memory cell once the threshold voltage is set.

In various apparatus embodiments, the magnitude adjuster sets voltages of successive pulses with successively larger voltage magnitudes. In further apparatus embodiments, the pulse width modulator controls the magnitudes of the durations of the pulses, with the pulse durations ranging between one and fifty microseconds. In some apparatus embodiments, the magnitudes of the pulse durations may vary from one pulse to another pulse in the sequence. The pulse width modulator in some apparatus embodiments may set the pulse durations early in the sequence when programming fast bits. The pulse width modulator in some apparatus embodiments may set the pulse durations late in the sequence when programming slow bits. In even further apparatus embodiments, the pulse generator creates varying amounts of time between pulses in the sequence of pulses.

Method embodiments generally comprise generating a sequence of pulses, applying the sequence of pulses to a memory cell to set a threshold voltage of the memory cell, and modulating among pulses in the sequence the parameters of pulse duration, pulse separation time, and step voltage magnitude. Some method embodiments include verifying the threshold voltage is within a predetermined voltage range. Some method embodiments include locking the threshold voltage.

In various method embodiments, applying the sequence of pulses to the memory cell comprises applying the sequence of pulses to a control gate of a not-AND (NAND) flash memory cell to alter a voltage of a floating gate. Further method embodiments comprise increasing initial pulse durations from approximately two microseconds to approximately ten microseconds in two microsecond increments per pulse for a fast memory cell. Even further method embodiments comprise successively increasing final sequence pulse durations from approximately ten microseconds to approximately twenty-five microseconds per pulse for a slow memory cell.

While portions of the following detailed discussion describe embodiments to program memory cells of NAND flash memory arrays, persons of ordinary skill in the art will recognize that alternative embodiments may program memory cells in other types of non-volatile memory devices, such as NOR flash memory or EEPROM memory devices. Persons of ordinary skill in the art will also recognize that programming the memory cells by applying the sequences of pulses to a control gate in various described embodiments may also be accomplished by applying the sequences of pulses to other parts of the memory cell, such as the drain terminal.

Turning now to the drawings, FIG. 1A depicts a system 100 employing a non-volatile memory programmer 116. As shown in FIG. 1A, system 100 may have a power supply 102 which supplies power to the various elements of system 100. For example, if system 100 is a desktop or laptop computer, then power supply 102 may convert 120 volts alternating current (VAC) to various volts direct current (VDC), such as 24 VDC, 12 VDC, and 5 VDC. Alternatively, in other embodiments system 100 may comprise a cellular telephone wherein power supply 102 may comprise a batter pack supplying 6 VDC to the elements of system 100.

In the embodiment shown in FIG. 1A, system 100 has a processor 104. Processor 104 may comprise a single or multiple-core processor in various embodiments, and may even comprise multiple processors. For example, processor 104 may have four cores coupled with internal processor cache memory. Processor 104 may execute operating instructions for programs and applications run by users of system 100, such as instructions of a web browser or a computer aided design (CAD) application. Such software programs and related instructions may be stored in a data input device 112. For example data input device 112 may comprise an Advanced Technology Attachment (ATA) device, such as an ATA hard drive, a compact disc (CD) drive, or a digital versatile disc (DVD) drive. Processor 104 may retrieve the instructions from data input device 112, temporarily store them in volatile memory 106, execute the instructions, and display results on display 110. For example the software program may comprise a Linux®, a Unix®, a Macintosh® OS X, a Windows® or some other operating system, wherein processor 104 executes instructions of the operating system in 4 gigabytes (GB) of DRAM represented by volatile memory 106.

Continuing with the example cited above when the embodiment of system 100 comprises a computer, non-volatile memory 108 may comprise a non-volatile memory chip on the motherboard or comprise a portable flash memory drive, such as a universal serial bus (USB) "thumb" drive. A user of system 100 may store programs, documents, and other types of information onto non-volatile memory 108. For example, non-volatile memory 108 may store basic input-output system (BIOS) routines and user-configurable boot parameters, such as hard-drive parameters, boot device sequence, video card memory size, display caching configuration, etc. The user may change the information on non-volatile memory 108 using data input device 112, which may comprise a keyboard. Non-volatile memory programmer 116 may use a sequence of modulated programming pulses to store the changed information onto non-volatile memory 108.

In an alternative embodiment, system 100 may comprise a digital camera or a video recorder, in which case system 100 may store pictures or video images in non-volatile memory 108. For example, if system 100 comprises a digital camera, the camera may capture a picture image from data input device 112 which may comprise a charged couple device. Data output device 114 may comprise a video output port for transmitting pictures or images to another system. Non-volatile memory programmer 116 may improve the rate that the camera stores information of the picture images onto non-volatile memory 108 by employing modulated programming pulses to save the information more quickly.

In a further alternative embodiment, system 100 may comprise a portable music player capable of capturing sound or music information from data input device 112 and playing the music through output device 114. For example, data input device 112 may comprise a microphone or an input from an internal radio, while output device 114 comprises a speaker. In such an embodiment, processor 104 may temporarily capture the music information in volatile memory 106 and use non-volatile memory programmer 116 to store the music information to a removable flash memory card comprising non-volatile memory 108. In further embodiments, system 100 may comprise a cellular telephone or a personal digital assistant (PDA). In these embodiments system 100 may use non-volatile memory programmer 116 to store personal information, such as names of contacts, addresses, telephone numbers, and appointments onto non-volatile memory 108.

System 100 may have fewer elements than the ones depicted in FIG. 1A. For example, some embodiments may not have a data output device 114. Other embodiments may not have volatile memory 105 and/or processor 104. Conversely, system 100 may have more elements than those shown in FIG. 1A, as well as more quantities of each of the elements. For example, some embodiments may have a memory controller hub to handle transactions between processor 104 and other elements in system 100. Alternatively, some embodiments may have two displays 110, a keyboard, a microphone, and a web cam comprising three data input devices 112. In other words, system 100 depicted in FIG. 1A is intended to provide illustrative embodiments. These are indicative of but a few of the various systems which may employ a non-volatile memory programmer 116.

Figure 1B:
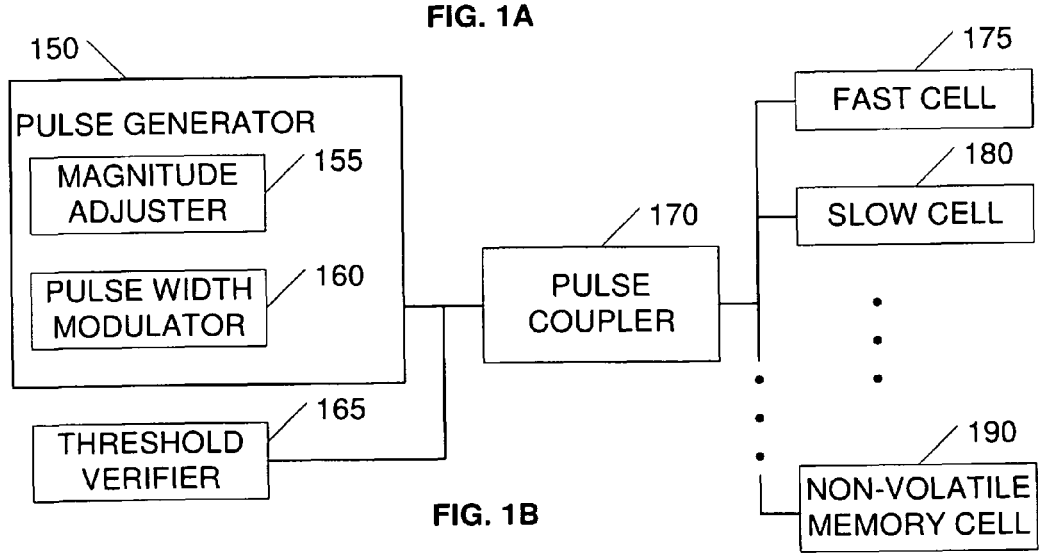
FIG. 1B shows an apparatus for programming non-volatile memory cells.

FIG. 1B shows an apparatus for programming non-volatile memory cells, comprising a pulse generator 150, a threshold verifier 165, and a pulse coupler 170. For example, pulse generator 150, threshold verifier 165, and pulse coupler 170 may comprise non-volatile memory programmer 116 shown in FIG. 1A. The apparatus of FIG. 1B may be used to program fast cells, such as fast cell 175, program slow cells, such as slow cell 180, and other types of non-volatile memory cells, such as non-volatile memory cell 190. For example, assume that non-volatile memory cell 190 is a "normal" cell, meaning that the threshold voltage (Vt) increases as much as an applied program step. Based on this reference, fast cell 175 may comprise a cell that has a Vt which increases more than the applied program step. Conversely, slow cell 175 may comprise a cell that has a Vt which increases less than the applied program step.

In some embodiments the non-volatile memory cells, such as fast cell 175 and non-volatile memory cell 190, may comprise single-bit NAND flash memory cells. In other embodiments, pulse generator 150 may program non-volatile semiconductor memory devices having multi-level memory cells each capable of storing a plurality of bits of data. With respect to these kinds of multilevel memory cells, setting the threshold voltage of each memory cell with numerous voltages may enable each memory cell to store a plurality of bits of data.

While programming memory cells (175, 180, and 190), pulse generator 150 may generate a sequence of pulses. Magnitude adjuster 155 may gradually increase the voltage magnitudes of the pulses while pulse width modulator 160 may vary the durations of the pulses in the sequence. Pulse coupler 170 may apply the sequence of pulses to one or more of the memory cells. For example, pulse coupler 170 may couple the sequence of pulses to the control gates of memory cells (175, 180, and 190) in a memory array.

The modulated sequence of voltage pulses may be applied to one or more of the memory cells (175, 180, and 190) until the threshold voltages of all the memory cells (175, 180, and 190) reach an initial threshold voltage, Vti. Threshold verifier 165 may measure the threshold voltage for each of the memory cells (175, 180, and 190). Once an individual memory cell has an acceptable threshold voltage, logic of the apparatus in FIG. 1B may trigger pulse coupler 170 to uncouple pulse generator 150 from that individual cell, yet continue to couple pulse generator 150 to the to remaining memory cells which have not yet acquired an acceptable threshold value. For example, pulse coupler 170 may manipulate the word lines and bit lines in the memory array to uncouple future pulses in the sequence from the individual cells that have acceptable threshold voltage values. This cycle of applying more pulses by pulse generator 150, verifying individual threshold voltages by threshold verifier 165, and uncoupling memory cells with acceptable threshold voltage values via pulse coupler 170 may continue until all memory cells being programmed have acceptable threshold voltage values. In other words, programming may continue until the threshold voltage values are all within a certain voltage tolerance of a target threshold value.

Figure 2A:
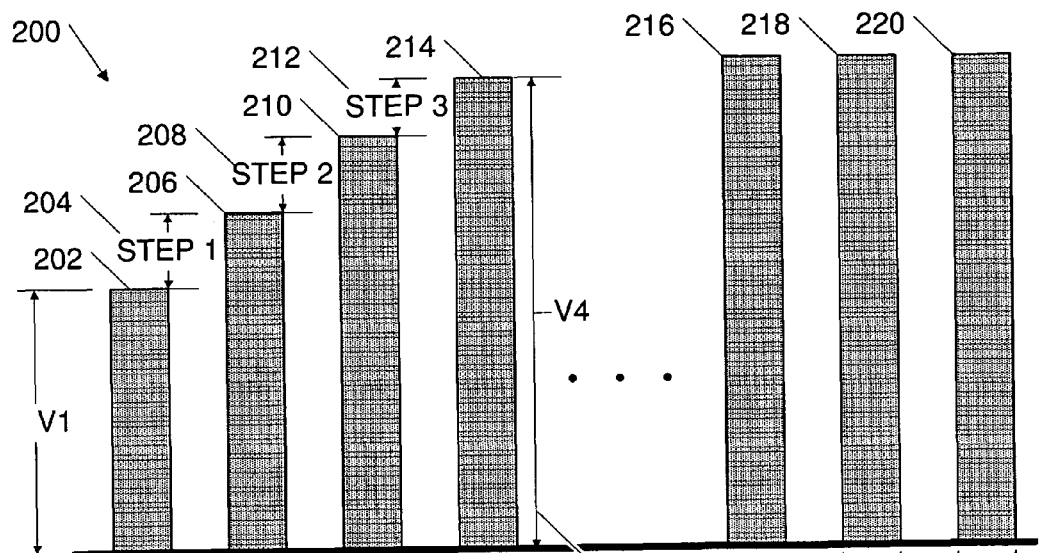
FIG. 2A shows a sequence of pulses that may be generated by an embodiment of a programming apparatus, as well as the various parameters that may be modulated by the apparatus.

FIG. 2A shows a sequence of pulses 200 that may be generated by an embodiment of a programming apparatus, such as non-volatile memory programmer 116. FIG. 2A illustrates the various parameters that may be modulated by the programming apparatus. Sequence of pulses 200 begins with pulse 202 having an initial or starting voltage magnitude 222 and pulse duration 224. Pulse 206 follows pulse 202, wherein pulse 206 has a voltage magnitude equal to voltage 222 plus a step voltage 204. Pulse 206 has pulse duration 226. The programming apparatus may generate subsequent pulses 210 and 214, both pulses having successively larger pulse voltage magnitudes increased by voltage steps 208 and 212, wherein pulse 214 has a total magnitude of voltage 230. The programming apparatus may generate a number of pulses similar to pulse 214, also having voltage magnitudes equal to or greater than voltage 230. Sequence of pulses 200 may end with pulses 216, 218, and 220, with varying numbers of pulses occurring between pulse 214 and pulse 216.

To improve performance when programming fast bits and slow bits, the programming apparatus may modulate various parameters of the pulses in sequence of pulses 200. For example, assume an embodiment of pulse generator 150, shown in FIG. 1B, is generating sequence of pulses 200. Magnitude adjuster 155 may set the voltage magnitudes of the pulses in sequence of pulses 200. Stated more specifically, magnitude adjuster 155 may set the magnitude of voltage 222 for pulse 202. When pulse generator 150 generates pulses 206 and 210, magnitude adjuster 155 may increase the voltage magnitudes by step voltages 204 and 208, respectively. Additionally, magnitude adjuster 155 may vary the magnitude of the step voltage from one pulse to the next. Magnitude adjuster 155 may increase or decrease the step voltage magnitude between pulses. For example, magnitude adjuster may make step voltage 208 smaller than step voltage 204 and make step voltage 212 larger than step voltage 204. In other words, magnitude adjuster 155 may modulate the voltage magnitude of each pulse in sequence of pulses 200.

In addition to modulating the voltage magnitudes of the pulses, pulse generator 150 may also use pulse width modulator 160 to control the durations of pulses in sequence of pulses 200. For example, pulse width modulator 160 may control pulse duration 224 for pulse 202, control pulse duration 226 for pulse 206, and control the pulse durations for the remaining pulses in sequence of pulses 200 including pulse durations 236 and 238 for end of sequence pulses 218 and 220, respectively. Pulse generator 160 may modulate the individual pulse durations, from pulse to pulse. For example, pulse generator 160 may make pulse duration 226 longer or shorter than pulse duration 224, make pulse duration 236 longer or shorter than pulse duration 226, etc.

A few examples will illustrate how a programming apparatus may improve performance by modulating pulse parameters when programming fast bits and slow bits. To provide a basis for measuring performance, on may define the programming time for a cell or a bit to be a function of several pulse generation properties. A first property may be defined to be a program pulse sequence (Pps), equal to the amount of time required to have an effective pulse. A second property may be defined to be the program pulse duration (Ppd). A third property may be defined to be program verify time (tpv), equal to the amount of time required to perform a program verification. The total program time, therefore, may be defined as number of pulses (np) multiplied by the sum of Pps, ppd, and tpv. In other words, the total program time may be calculated by the following formula: (pps+ppd+tpv)* np.

Fast Bits

Pulse generator 150 may generate sequence of pulses 200 to program fast cell 175. Magnitude adjuster 155 may create pulse 202 with starting voltage 222. For example, starting voltage 222 may be equal to 15 volts (V). Pulse generator 150 may generate pulses 206, 210, and 214 having voltage magnitudes of 15.5V, 16V, and 16.5V, respectively. Magnitude adjuster 155 may continue increasing the voltage magnitudes such that pulses 216, 218, and 220 have voltages of 18.5V, 19V, and 19.5V, respectively. Each pulse may have a duration of 10 microseconds (µs), for example. In total, pulse generator 150 may generate 11 pulses. While coupling sequence of pulses 200 to fast cell 175, threshold verifier 165 may determine that the voltage threshold varies between 0.5V and 2.1V; (0.5<Vt<2.1). In other words, the voltage distribution width may be equal to 1.6V. Such a voltage distribution may be too large, meaning that start voltage 222 should be reduced.

Pulse generator 150 may create another sequence of pulses 200 to program fast cell 175, wherein pulse 202 has a starting voltage 222 lowered to 14V. As pulse generator 150 generates pulses 206 through pulse 220, magnitude adjuster 155 may increase the voltage magnitude of each pulse by 0.5V ending up with pulse 220 having a voltage of 20.5V. Pulse generator 150 may generate a total of 14 pulses, each pulse having a pulse duration of 10 µs. Threshold verifier 165 may determine that the voltage threshold varies between 0.5V and 1.35V. A distribution width of 0.85V may be acceptable. However, to achieve this distribution width, pulse generator 150 had to generate three more pulses; (11 versus 14). The corresponding programming time given by the formula (pps+ppd+tpv)* np, may be equal to 140 µs.

Figure 2B:
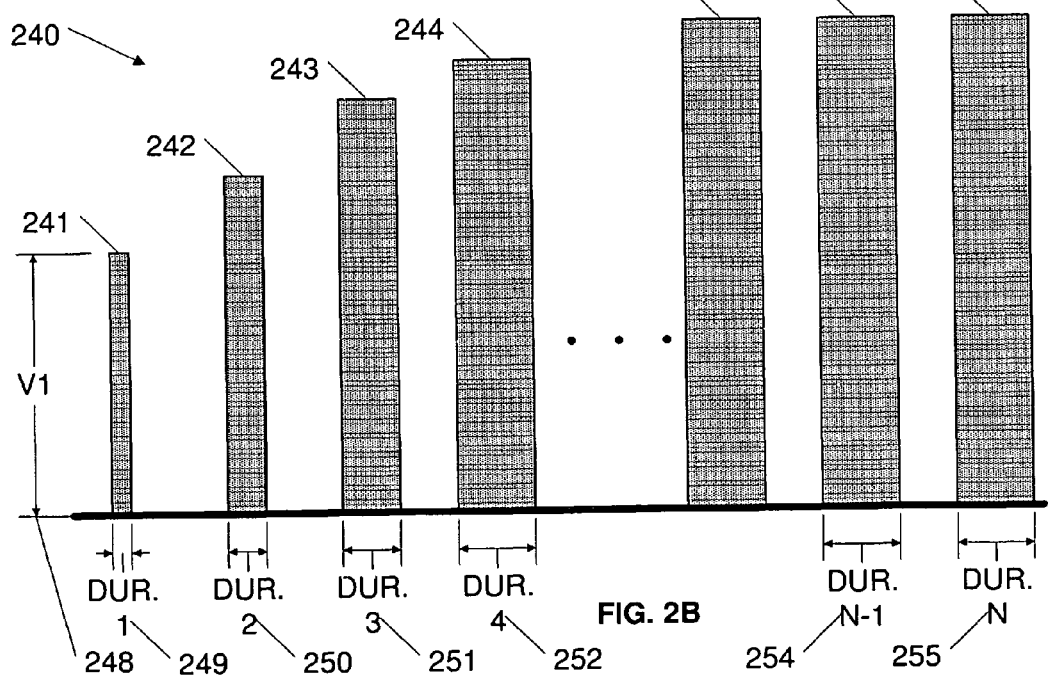
FIG. 2B shows a sequence of pulses that may be generated by an embodiment of a programming apparatus when programming a fast bit.

Instead of lowering starting voltage 222 of pulse 202 to 14V and generating 14 pulses, pulse generator 150 may instead generate sequence of pulses 240, shown in FIG. 2B, to program fast cell 175. Pulse generator 150 may create pulse 241, with magnitude adjuster 155 adjusting the starting voltage 248 to 15V. Pulse width modulator 160 may set pulse duration 249 of pulse 241 to equal 2 µs. As pulse generator 150 generates pulses 242, 243, and 244, magnitude adjuster 155 may set the voltages at 15.5V, 16V, and 16.5V, respectively, while pulse width modulator 160 sets the corresponding pulse durations (250, 251, and 252) at 4 µs, 6 µs, and 8 µs, respectively. Using magnitude adjuster 155, pulse generator 150 may conclude sequence of pulses 240 with pulses 245, 246, and 247 having voltage magnitudes out of 18.5V, 19V, and 19.5V, respectively. Pulse width modulator 160 may create 10 µs pulse durations 254 and 255 for pulses 246 and 247, respectively. In total, pulse generator 150 may generate a total of 11 pulses. Threshold verifier 165 may determine that the voltage threshold varies between 0.5V and 1.35V, which may again be acceptable. By using pulse width modulator 160 to gradually increase pulse durations 249 to 252 from 2 µs to 8 µs, for initial pulses 241 to 244, respectively, pulse generator 150 may program fast cell 175 with a higher (15V) starting voltage 248 and yet use fewer pulses; (11 versus 14). In this scenario, the overall programming time given by the formula (pps+ppd+tpv)* np, may be decreased from 140 µs to 100 µs.

Slow Bits

Pulse generator 150 may modulate various pulse sequence parameters to program slow cell 180. For example, pulse generator 150 may generate sequence of pulses 200 to program slow cell 180. Magnitude adjuster 155 may set starting voltage 222 equal to 16V. Magnitude adjuster 155 may increase the voltage magnitudes of subsequent pulses by 0.5V, such that pulse 210 has a voltage magnitude of 17V and pulse 214 has a voltage magnitude of 17.5V. Magnitude adjuster 155 may continue increasing the voltage magnitudes of subsequent pulses to a maximum pulse voltage of, for example, 21V. In other words, pulses 216, 218, and 220 may each have a voltage magnitude of 21V. Pulse width modulator 160 may set pulse durations 224 through 238 for each of the pulses in sequence of pulses 200 equal to 10 µs. Threshold verifier 165 may determine that the Vt distribution is between 3.5 V and 4V. Overall, pulse generator 150 may need to generate 17 pulses to program slow cell 180. Such a large number of pulses may result from the fact that magnitude adjuster 155 only generates a maximum voltage of 21V which may be caused, for example, by charge pump saturation. This saturation may effectively lead to a lower slope for pulses at the end of sequence of pulses 200. The corresponding programming time in this scenario may be given by the formula (pps+ppd+tpv)* np and equal 180 µs.

Figure 2C:
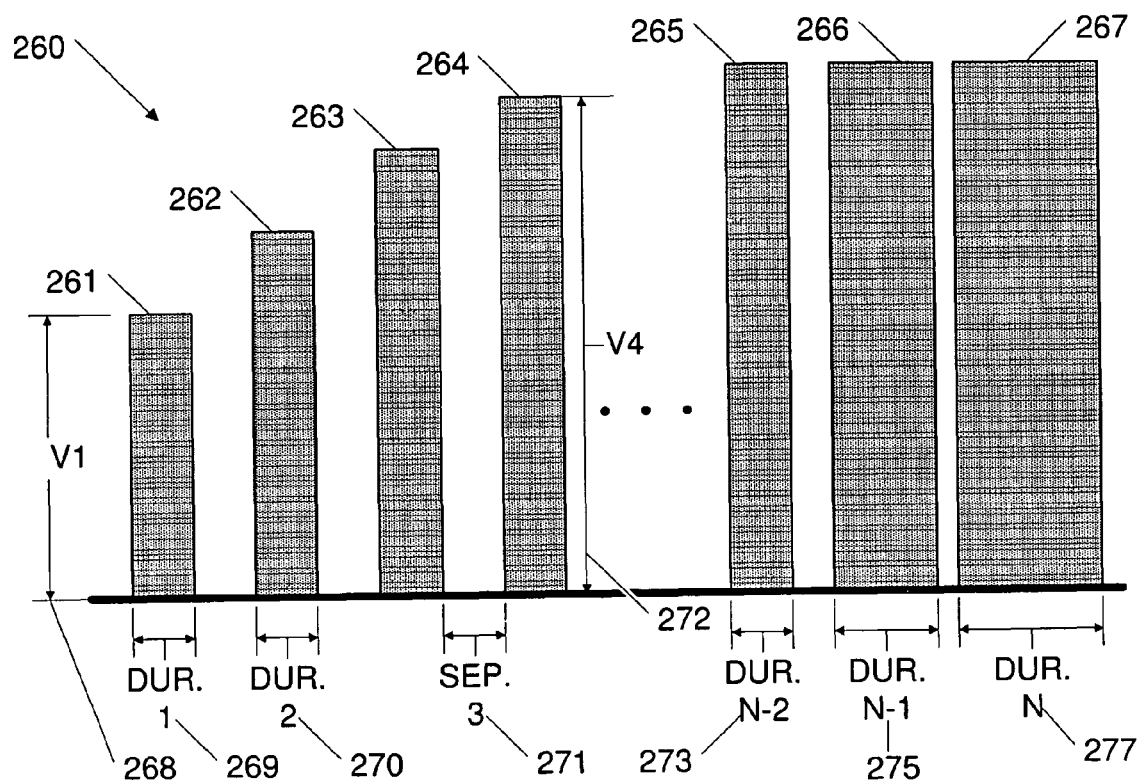
FIG. 2C shows a sequence of pulses that may be generated by an embodiment of a programming apparatus when programming a slow bit.

To improve the performance of programming slow cell 180, pulse generator 150 may generate sequence of pulses 260 shown in FIG. 2C. Pulse generator 150 may generate pulses 261, 262, 263, and 264 with magnitude adjuster 155 setting the voltages equal to 16 V (element 268), 16.5 V, 17 V, and 17.5 V (element 272), respectively. Pulse width modulator 160 may set the pulse durations for the initial pulses, such as pulse durations 269 and 270, equal to 10 µs. However, to offset the effects of charge saturation for end of sequence pulses 265, 266, and 267, pulse width modulator 160 may set pulse duration 273 equal to 15 µs, set pulse duration 275 equal to 20 µs, and set pulse duration 277 to 25 µs. Additionally, pulse width modulator 160 may decrease the amounts of time between each of the pulses in the end of sequence pulses 265, 266, 267. For example, pulse width modulator 160 may set the amount of time between pulses early in the sequence, such as pulse separation 271, equal to 5 µs.

By programming slow cell 180 with sequence of pulses 260 instead of sequence of pulses 200, pulse generator 150 may be able adjust the slope for the end of sequence pulses 265, 266, and 267. In doing so, pulse generator 150 may be able to decrease the number of pulses needed to program slow cell 180 from 17 pulses to 13. In this scenario, the overall programming time given by the formula (pps+ppd+tpv)* np, may be decreased from 180 µs to 140 µs. In other words, pulse generator 150 may increase pulse duration times and decrease pulse separation times for end of sequence pulses to offset the negative effects of charge pump saturation and increase performance while programming slow cell 180. Such performance increase may result from the fact that slow cells may be more efficiently programmed with larger pulses.

Figure 2D:
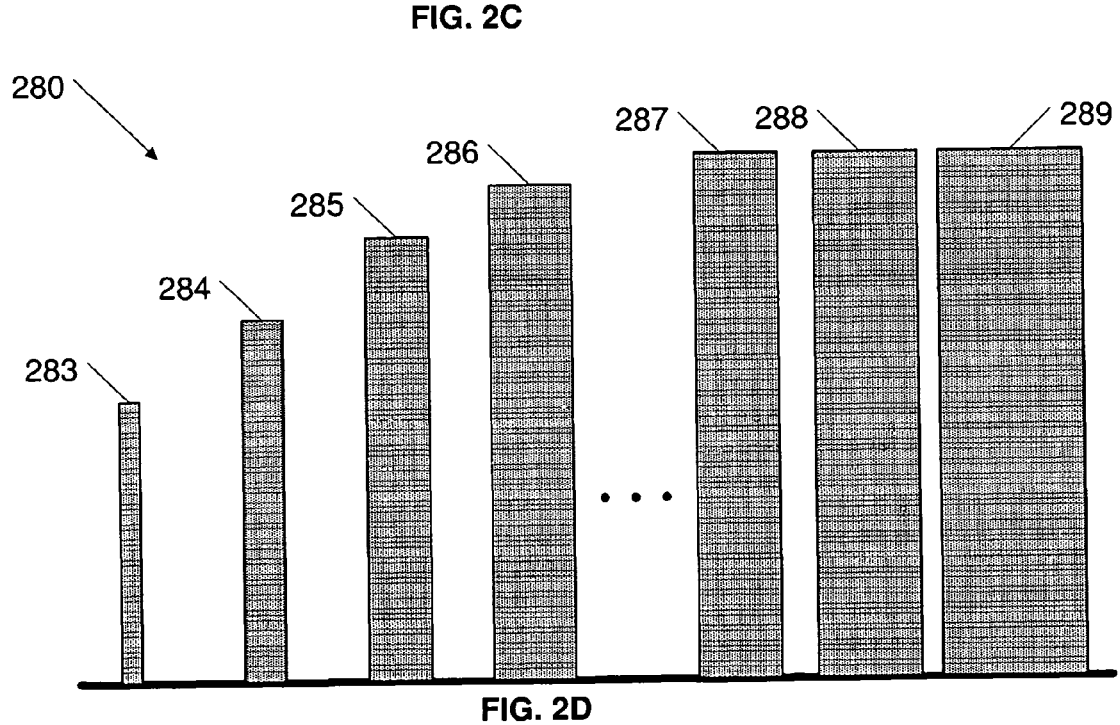
FIG. 2D shows a sequence of pulses that may be generated by an embodiment of a programming apparatus when programming both a fast bit and a slow bit.

FIG. 2D shows a sequence of pulses 280 that may be generated by an embodiment of a programming apparatus when programming both fast bits and slow bits. For example, for pulses early in sequence of pulses 280 pulse generator 150 may generate pulses 283, 284, 285, and 286 similar to pulses 241, 242, 243, and 244, respectively, shown in FIG. 2B. Such initial pulses may effectively program fast cells, such as fast cell 175. For pulses at the end of sequence of pulses 280, pulse generator 150 may generate pulses 287, 288, and 289 similar to pulses 265, 266, and 267 shown in FIG. 2C, respectively. Such end of sequence pulses may effectively program slow cells, such as slow cell 180.

As the discussion for FIGS. 2A through 2D illustrate, embodiments of programming apparatuses, such as pulse generator 150 or non-volatile memory programmer 116, may modulate program pulse duration in order to have better control of programming fast, slow, and even normal cells. Additionally, such programming apparatuses may also modulate step voltage increases and pulse separations to have better control of programming fast, slow, and normal cells. By modulating such pulse and pulse sequence parameters, the programming apparatuses may have both narrow Vt distributions and high performance (faster programming times).

Figure 3:
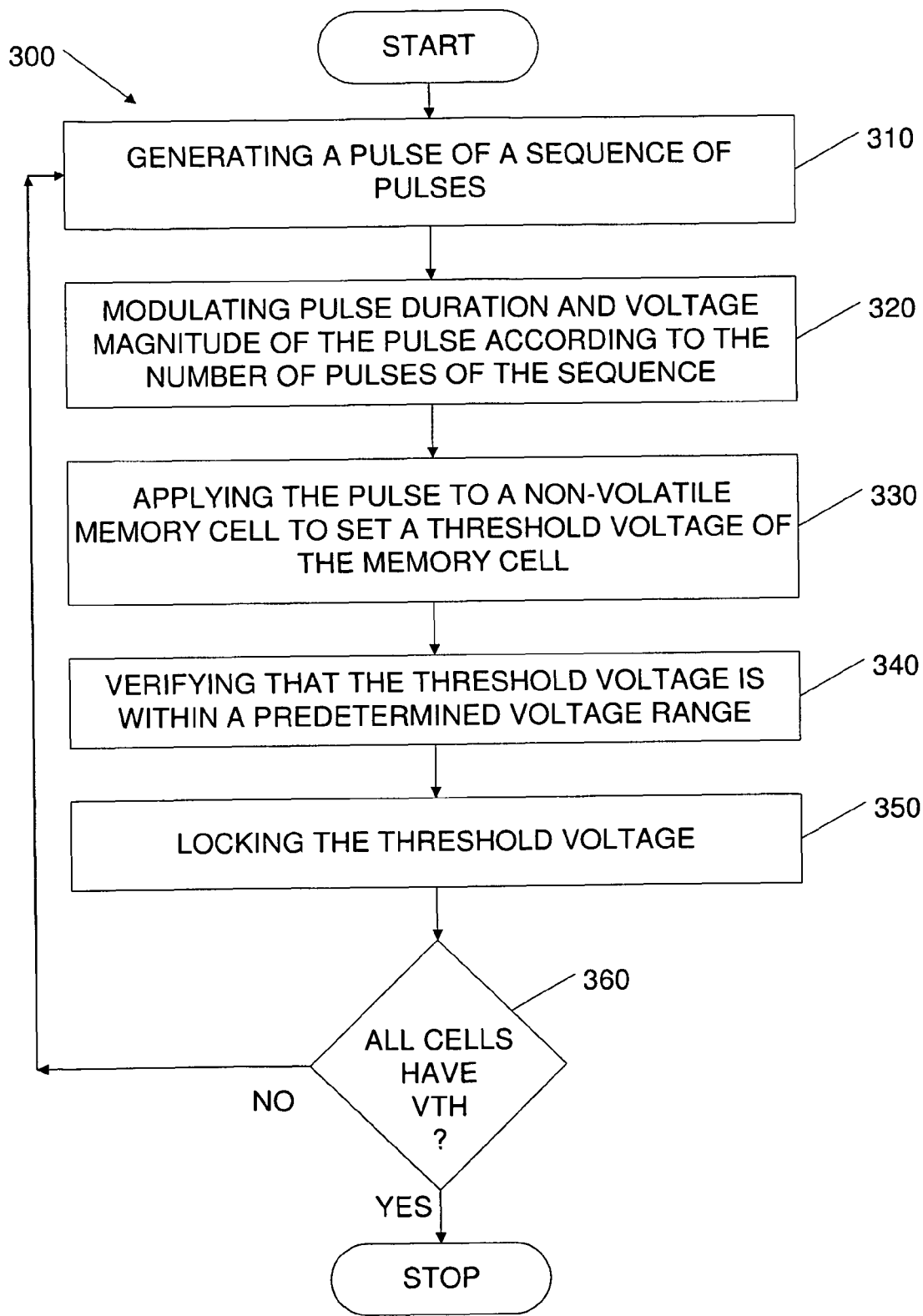
FIG. 3 illustrates a method for programming a non-volatile semiconductor memory cell.

FIG. 3 depicts a flowchart 300 illustrating an embodiment of a method for programming a non-volatile semiconductor memory cell. Flowchart 300 begins with generating a pulse of a sequence of pulses (element 310). For example, non-volatile memory programmer 116 may generate pulse 261 in sequence of pulses 260 shown in FIG. 2C. An embodiment according to flowchart 300 may continue by modulating pulse duration and/or step voltage magnitude of the pulse according to the number of pulses of the sequence (element 320). For example, non-volatile memory programmer 116 may set the voltage magnitude of pulses 261 to 15V while setting the duration to 8 µs.

An embodiment according to flowchart 300 may continue by applying the pulse to a non-volatile memory cell, or to an array of such memory cells, to set a threshold voltage of the memory cell (element 330). For example, pulse coupler 170 may couple the pulse generated by pulse generator 150 to non-volatile memory cell 190. An embodiment according to flowchart 300 may continue by verifying that the threshold voltage for the memory cell is within a predetermined voltage range (element 340). For example, after generating pulse 261 and applying it to non-volatile memory cell 190, pulse threshold verifier 165 may determine whether or not the Vt for non-volatile memory cell 190 is between 0.5V and 1.1V. Assuming the Vt is within the range, an embodiment may then lock the threshold voltage for memory cell 190 (element 350). For example, in some embodiments pulse coupler 170 may isolate pulse generator 150 from non-volatile memory cell 190. In alternative embodiments, a locking circuit may set a status bit or a locking bit of memory cell 190 so that pulse generator 150 and/or pulse coupler 170 will send no more programming pulses to memory cell 190.

The method of flowchart 300 may then determine whether all of the cells have threshold voltages within the predetermined range (element 360). For example threshold verifier 165 may determine if all of the cells of a block, page, or word have threshold voltages between 0.5V and 1.1V. If all cells have acceptable values of Vt, the process of programming non-volatile memory cells may stop. Otherwise, if remaining cells do not have acceptable threshold values, an embodiment according to flowchart 300 may continue by repeating the process. The embodiment may generate subsequent pulses in sequence of pulses 260, modulate the pulses, apply them to the remaining cells, verifying that the threshold values for the remaining cells are acceptable, and locking the threshold values for the cells (elements 310 through 350). For example, non-volatile memory programmer 116 may generate pulses 262, 263, and 264 to 15V, 16V, 13V, and 17V, respectively. Non-volatile memory programmer 116 may also generate the remaining pulses in sequence of pulses 260. Non-volatile memory programmer 116 may, for example, set pulse durations 269 and 270 equal to 8 μs and 10 μs, respectively, while setting pulse durations 273, 275, and 277 to 30 μs, 20 μs, and 40 μs, respectively. Additionally, non-volatile memory programmer 116 may set pulse separation 271 to 5 μs, while setting other pulse separations to other values such as 8 μs and 4 μs. Upon the generation of each of the individual pulses, an embodiment according to flowchart 300 may perform the application, verification, and locking operations (elements 330, 340, and 350) for the individual cells, as described in flowchart 300. When the Vt for each cell has been set (element 360), the process may stop.

It will be apparent to those skilled in the art having the benefit of this disclosure that the embodiments herein contemplate methods and apparatuses for programming non-volatile semiconductor memory devices by using modulated pulses. It is understood that the form of the embodiments shown and described in the detailed description and the drawings are to be taken merely as examples. It is intended that the following claims be interpreted broadly to embrace all the variations of the embodiments disclosed.

Although some aspects have been described in detail for some embodiments, it should be understood that various changes, substitutions and alterations can be made herein without departing from the spirit and scope of the embodiments as defined by the appended claims. Although one embodiment may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed that perform substantially the same function or achieve substantially the same result as the corresponding embodiments described herein may be utilized according to the embodiments herein. Accordingly, the appended claims are intended to include within their scope such processes, machines, manufacture, compositions of matter, means, methods, or steps.

What is claimed is:

1. An apparatus for programming a non-volatile memory cell, comprising:
   a pulse generator configured to create a sequence of pulses and set a threshold voltage of the non-volatile memory cell, wherein the pulse generator comprises:
   a magnitude adjuster configured to set voltage magnitudes of pulses in the sequence,
   a pulse width modulator configured to control durations of pulses in the sequence, wherein the pulse width modulator is configured to vary the durations of individual pulses; and
   a pulse coupler configured to couple the sequence of pulses to the non-volatile memory cell.

2. The apparatus of claim 1, further comprising a threshold verifier configured to verify that the threshold voltage is set within a predetermined number of volts of a target threshold voltage.

3. The apparatus of claim 1, further comprising a locking circuit to lock the threshold voltage of the non-volatile memory cell.

4. The apparatus of claim 3, wherein the locking circuit is arranged to lock the threshold voltage by uncoupling the pulse generator from the non-volatile memory cell.

5. The apparatus of claim 1, wherein the magnitude adjuster is arranged to set first, second, and third voltage magnitudes for a first, second, and third pulse, respectively, wherein the second voltage magnitude is larger than the first voltage magnitude by a first voltage amount and the third voltage magnitude is larger than the second voltage magnitude by a second voltage amount, wherein further the second voltage amount is greater than the first voltage amount.

6. The apparatus of claim 5, wherein the pulse generator is arranged to generate at least one pulse in the sequence before the first pulse.

7. The apparatus of claim 1, wherein the pulse width modulator is arranged to control the durations of the pulses between one microsecond and fifty microseconds.

8. The apparatus of claim 1, wherein the pulse width modulator is arranged to set a first duration of a first pulse and set a second duration of a second pulse, the second duration longer than the first duration.

9. The apparatus of claim 8, wherein the pulse width modulator is arranged to set the first and second durations early in the sequence of pulses when the non-volatile memory cell comprises a fast memory cell.

10. The apparatus of claim 8, wherein the pulse width modulator is arranged to set the first and second durations at the end of the sequence of pulses when the non-volatile memory cell comprises a slow not-AND (NAND) flash memory cell.

11. The apparatus of claim 1, wherein the pulse generator is arranged to create a first amount of time between a first pulse and a second pulse, to create a second amount of time between the second pulse and a third pulse, with the second amount of time being smaller than the first amount of time.

12. A method of programming a non-volatile semiconductor memory cell, the method comprising:
   generating a sequence of pulses;
   modulating, among pulses in the sequence, at least one of:
      pulse duration, wherein modulating pulse duration comprises varying the durations of individual pulses, and
      step voltage magnitude; and
   applying the sequence of pulses to the memory cell to set a threshold voltage of the memory cell.

13. The method of claim 12, further comprising verifying the threshold voltage is within a predetermined voltage range.

14. The method of claim 12, further comprising locking the threshold voltage.

15. The method of claim 12, wherein applying the sequence of pulses to the memory cell comprises applying the sequence of pulses to a control gate of a NAND flash memory cell to alter a voltage of a floating gate.

16. The method of claim 12, wherein the modulating comprises increasing initial pulse durations from approximately two microseconds to approximately ten microseconds in two microsecond increments per pulse for a fast memory cell.

17. The method of claim 12, wherein the modulating comprises successively increasing final pulse durations from approximately ten microseconds to approximately twenty-five microseconds per pulse for a slow memory cell.

* * * * *